(12) United States Patent  (10) Patent No.: US 8,877,532 B2
Hiroki et al.  (45) Date of Patent: Nov. 4, 2014

(54) METHOD OF MANUFACTURING ORGANIC ELECTROLUMINESCENCE DISPLAY DEVICE

(75) Inventors: Tomoyuki Hiroki, Mobara (JP); Taro Endo, Kawasaki (JP); Itaru Takaya, Chiba (JP); Koichi Ishige, Mobara (JP); Nobuhiko Sato, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/421,247

(22) Filed: Mar. 15, 2012

(65) Prior Publication Data

US 2012/0252150 A1  Oct. 4, 2012

(30) Foreign Application Priority Data

Mar. 30, 2011  (JP) .................................. 2011-074836
Feb. 8, 2012  (JP) .................................. 2012-024830

(51) Int. Cl.
*H01L 51/40*  (2006.01)
*H01L 51/56*  (2006.01)
*H01L 51/00*  (2006.01)

(52) U.S. Cl.
CPC ............ *H01L 51/0017* (2013.01); *H01L 51/56* (2013.01); *H01L 51/0014* (2013.01)
USPC ................... 438/34; 257/93; 257/40; 257/91; 257/79; 257/13; 257/84; 257/88; 257/89; 257/39

(58) Field of Classification Search
USPC ....................................... 438/1; 445/1, 23, 24
See application file for complete search history.

(56) References Cited

U.S. PATENT DOCUMENTS

| 6,617,186 B2 | 9/2003 | Kashiwabara |
| 7,132,789 B2 * | 11/2006 | Kobayashi .................... 313/504 |
| 7,163,831 B2 | 1/2007 | Hasegawa et al. |
| 7,220,998 B2 | 5/2007 | Kashiwabara |

(Continued)

FOREIGN PATENT DOCUMENTS

| CN | 1347268 A | 5/2002 |
| CN | 101562192 A | 10/2009 |

(Continued)

OTHER PUBLICATIONS

Office Action in Korean Application No. 10-2012-0030365 (date Apr. 19, 2014).
Office Action in Chinese Application No. 201210090411.5 (dated Jul. 28, 2014).

*Primary Examiner* — Zandra Smith
*Assistant Examiner* — Damian A Hillman
(74) *Attorney, Agent, or Firm* — Fitzpatrick, Cella, Harper & Scinto

(57) ABSTRACT

A method of manufacturing an organic electroluminescence display device includes an organic compound layer which is placed between a pair of electrodes and includes at least an emission layer, the organic compound layer being two-dimensionally arranged, includes forming the organic compound layer which is insoluble in water in an entire emission region on a substrate, providing a mask layer containing a water-soluble material in at least a part of a region on the organic compound layer, removing a part of the organic compound layer which is provided in a region which is other than the region in which the mask layer is provided, removing the mask layer, and forming, after the removing of the mask layer, a layer containing at least an alkali metal or an alkaline-earth metal in a region including at least the emission region.

7 Claims, 6 Drawing Sheets

(56) References Cited

U.S. PATENT DOCUMENTS

| | | |
|---|---|---|
| 7,615,388 B2 | 11/2009 | Kashiwabara |
| 7,914,976 B2 * | 3/2011 | Tachikawa et al. ............ 430/321 |
| 8,021,203 B2 * | 9/2011 | Kashiwabara .................. 445/24 |
| 2004/0235209 A1 | 11/2004 | Hasegawa et al. |
| 2008/0299365 A1 * | 12/2008 | Choi et al. .................... 428/213 |
| 2009/0053963 A1 * | 2/2009 | Takahashi et al. .............. 445/24 |

FOREIGN PATENT DOCUMENTS

| | | |
|---|---|---|
| JP | 2003-036971 A | 2/2003 |
| JP | 2005-510034 A | 4/2005 |
| JP | 2006-058497 A | 3/2006 |
| JP | 3813069 B2 | 8/2006 |
| JP | 4507759 B2 | 7/2010 |
| JP | 2010-234234 A | 10/2010 |

\* cited by examiner

METHOD OF MANUFACTURING ORGANIC ELECTROLUMINESCENCE DISPLAY DEVICE

BACKGROUND OF THE INVENTION

1. Field of the Invention

The present invention relates to a method of manufacturing an organic electroluminescence (EL) display device and a manufacturing apparatus for carrying out the manufacturing method.

2. Description of the Related Art

A generally known display device having organic EL elements mounted thereon is a device in which pixels each having a single or multiple organic EL elements are arranged in a predetermined pattern. By those pixels, an emission region of the display device is two-dimensionally and finely divided. The organic EL elements included in the pixels are electronic elements which output, for example, any one of red light, green light, and blue light. A display device having organic EL elements mounted thereon obtains a full-color image by driving the organic EL elements for outputting desired colors at desired emission intensities.

By the way, in an organic EL element which is a component of a display device, an organic compound layer which is a component of the element is a thin film layer formed by forming a thin film made of an organic material by vapor deposition or the like. When the organic compound layer which is a component of the organic EL element of the display device is formed for each element, a fine patterning technology is necessary. In order to carry out patterning when an organic compound layer is vapor deposited, a fine metal mask the fineness of which is according to the fineness of the patterning is necessary. However, in a metal mask, a vapor deposited film which adheres when vapor deposition operation is performed may narrow an opening in the mask or stress may deform the opening in the mask. Therefore, it is necessary to clean the mask used after film formation for a fixed number of times, which is a disadvantageous factor from the viewpoint of manufacturing costs. Further, partly due to a limitation on the process accuracy of the mask, the pixel size has a limit of about 100 μm, which is disadvantageous to a finer size. Further, with regard to the substrate size, when a fine metal mask is increased in size, in order to secure the positional accuracy of the opening in the mask, it is necessary to enhance the stiffness of a frame of the mask. However, when the stiffness of the mask is enhanced, an increase in the weight of the mask itself is caused accordingly. Therefore, from the viewpoint of both processability and handling, it is difficult to manufacture large format display devices of the fourth and subsequent generations, and an optimum manufacturing process of a fine organic EL element and a display device having the organic EL element mounted thereon has not taken shape at present.

Under those circumstances, a method of manufacturing a display device having a fine organic EL element without using a metal mask is proposed. A method proposed in Japanese Patent No. 3813069 is a specific example of such a method. Here, the method proposed in Japanese Patent No. 3813069 is a method in which, after repeating three times for the respective colors a step of leaving an organic compound layer formed on an entire surface of a substrate selectively in a predetermined location by patterning using photolithography, a common electrode is formed. Another method which uses photolithography is proposed in Japanese Patent No. 4507759. Japanese Patent No. 4507759 discloses a method in which, through provision on an organic compound layer a water-soluble intermediate layer and carrying out photolithography, an organic compound layer is patterned.

However, when photolithography is used to pattern the organic compound layer which forms the organic EL element, there are some problems to be solved.

A first problem is that a constituent material of the organic compound layer is dissolved in an organic solvent used in a photo process. Here, the process proposed in Japanese Patent No. 3813069 enables an organic EL display device with higher definition compared with a case of a conventional method using a fine metal mask. However, there is a limitation that materials usable in the process proposed in Japanese Patent No. 3813069 are limited to materials which are insoluble in all of a photoresist solvent, a photoresist developer, and a photoresist remover. As a photoresist developer widely used in a manufacturing process of a silicon wafer or a substrate for a TFT, an organic solvent such as tetramethylammonium hydroxide is used. However, the constituent material of the organic compound layer is soluble in such an organic solvent, and thus, for example, a problem arises that, in a step of applying the resist, the constituent material of the organic compound layer and the resist are compatible with each other. Accordingly, for the sake of industrialization, for example, it is necessary to develop and prepare a dedicated photoresist material.

A second problem is that constituent materials of an electron injection layer and a cathode are required to be water-resistant. In an organic EL element manufactured by vacuum deposition, it is generally known to use an alkali metal compound as a constituent material of the electron injection layer for higher efficiency and lower voltage of the element. However, an alkali metal compound is a compound which is water-soluble or the characteristics of which are deteriorated by water. Therefore, in the process proposed in Japanese Patent No. 4507759, when an alkali metal compound is used as a constituent material of the electron injection layer, a problem arises that, when the organic compound layer is immersed in water or the like at a photolithography step, the electron injection layer is eluted. Even if the elution does not occur, a problem arises that, when the organic compound layer is immersed in water or the like, the electron injection characteristics of the electron injection layer are deteriorated.

SUMMARY OF THE INVENTION

The present invention has been made to solve the above-mentioned problems, and an object of the present invention is to provide a manufacturing method for obtaining a highly efficient high-definition organic EL display device.

The present invention provides a method of manufacturing an organic electroluminescence display device including multiple electroluminescence elements, each of the multiple electroluminescence elements including an organic compound layer provided between a first electrode and a second electrode, the organic compound layer including at least an emission layer, the method including; forming on a substrate having the first electrode provided thereon the organic compound layer which is insoluble in water, providing a mask layer containing a water-soluble material in a part of a region in which the organic compound layer is formed, removing a part of the organic compound layer which is formed in a region in which the mask layer is not provided, removing the mask layer; and forming, after the removing of the mask layer, a layer containing one of an alkali metal and an alkaline-earth metal.

According to the present invention, a highly efficient high-definition organic EL display device may be provided. Further, the manufacturing method according to the present invention does not use a fine metal mask. Therefore, when the organic EL display device is manufactured, the pixel size may be controlled to be about 10 µm, and even when the substrate size is large as in the fifth and subsequent generations, a high-definition organic EL display device may be materialized.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

A method of manufacturing an organic EL display device according to the present invention is a method of manufacturing an organic EL display device in which EL elements having between a first electrode and a second electrode an organic compound layer including at least an emission layer provided therein are two-dimensionally arranged.

Here, the method of manufacturing an organic EL display device according to the present invention includes the following steps (A) to (E).

(A) a step of forming on a substrate having a first electrode provided thereon an organic compound layer which is insoluble in water (B) a step of providing a mask layer containing a water-soluble material in a part of a region in which the organic compound layer is formed (C) a step of removing a part of the organic compound layer that is formed in a region in which the mask layer is not provided (D) a step of removing the mask layer (E) a step of forming, after the removing of the mask layer, a layer containing one of an alkali metal and an alkaline-earth metal Note that, the respective steps are described in detail in the following.

Figure 1A:
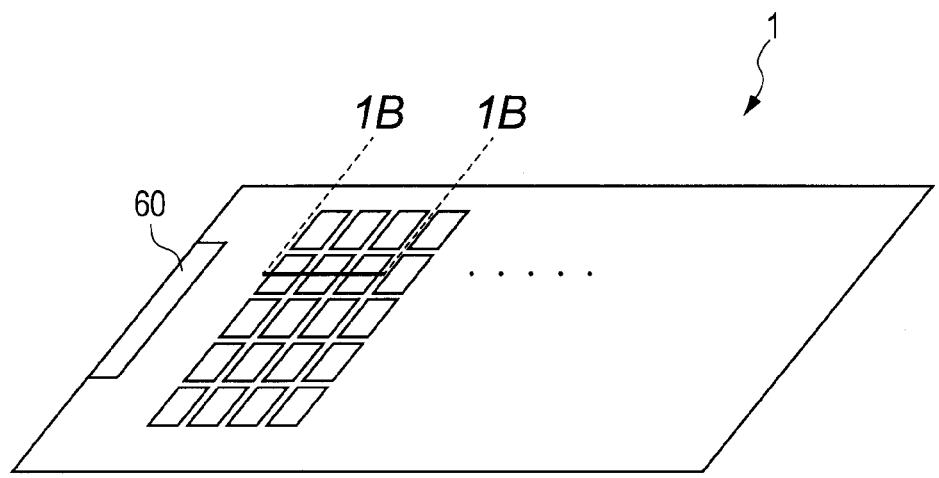
FIGS. 1A and 1B are a schematic view and a schematic sectional view, respectively, illustrating an exemplary organic EL display device manufactured by a method of manufacturing an organic EL display device according to the present invention.
Figure 1B:
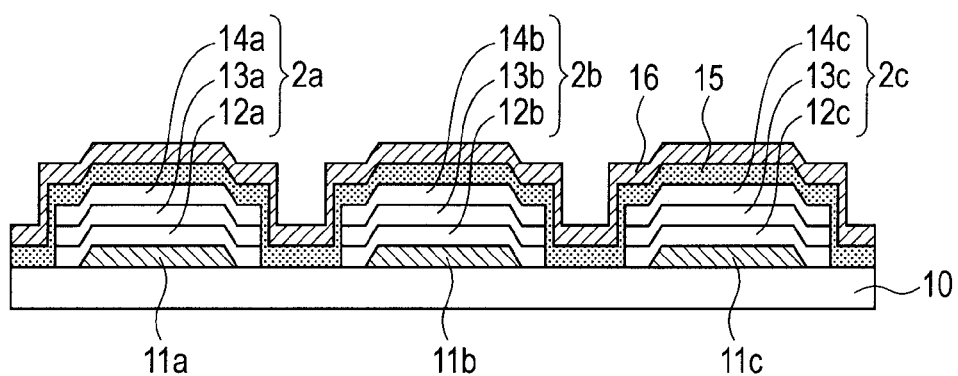

Hereinafter, the method of manufacturing an organic EL display device according to the present invention is described in detail in the following with reference to the attached drawings. FIG. 1A is a schematic view illustrating an exemplary organic EL display device manufactured by the method of manufacturing an organic EL display device according to the present invention, and FIG. 1B is a schematic sectional view taken along the line 1B-1B of FIG. 1A. An organic EL display device 1 illustrated in FIGS. 1A and 1B is a top emission type organic EL display device in which light is taken out from a side opposite to a substrate 10, but the manufacturing method according to the present invention may also be applied to a bottom emission type organic EL display device in which light is taken out from the substrate side.

The organic EL display device 1 illustrated in FIGS. 1A and 1B is a display device in which organic EL elements in groups of three of different kinds are two-dimensionally arranged. Further, the organic EL display device 1 illustrated in FIGS. 1A and 1B may display an image according to signals which are input through an external connection terminal 60 by lighting and unlighting through electric control according to image data.

In the organic EL display device 1 illustrated in FIGS. 1A and 1B, blue organic EL elements, green organic EL elements, and red organic EL elements are provided. Here, in a blue organic EL element, a first electrode 11a, a hole transport layer 12a, an emission layer 13a, an electron transport layer 14a, an electron injection layer 15, and a second electrode 16 are provided in the stated order on the substrate 10. Note that, in the following description, a laminate formed by layers included in blue organic EL elements other than electrodes (the first electrode 11a and the second electrode 16) and the electron injection layer (including the layers 12a, 13a, and 14a) is sometimes referred to as a blue organic compound layer 2a.

Here, in a green organic EL element, a first electrode 11b, a hole transport layer 12b, an emission layer 13b, an electron transport layer 14b, the electron injection layer 15, and the second electrode 16 are provided in the stated order on the substrate 10. Note that, in the following description, a laminate formed by layers included in green organic EL elements other than electrodes (the first electrode 11b and the second electrode 16) and the electron injection layer 15 (including the layers 12b, 13b, and 14b) is sometimes referred to as a green organic compound layer 2b.

Here, in a red organic EL element, a first electrode 11c, a hole transport layer 12c, an emission layer 13c, an electron transport layer 14c, the electron injection layer 15, and the second electrode 16 are provided in the stated order on the substrate 10. Note that, in the following description, a laminate formed by layers included in red organic EL elements other than electrodes (the first electrode 11c and the second electrode 16) and the electron injection layer 15 (including the layers 12c, 13c, and 14c) is sometimes referred to as a red organic compound layer 2c.

Note that, the structure of each of the organic compound layers (2a, 2b, and 2c) is not specifically limited insofar as the emission layer (13a, 13b, or 13c) is included therein. Here, exemplary layers which may be included in the organic compound layer (2a, 2b, or 2c) include, in addition to the emission layer, a hole injection layer, a hole transport layer, an electron transport layer, a hole blocking layer, and an electron blocking layer.

The organic EL element included in the organic EL display device 1 illustrated in FIGS. 1A and 1B emits light through the following steps (i) to (iii):

(i) causing current to pass between the first electrode 11a (11b or 11c) and the second electrode 16;

(ii) recombining in the emission layer 13a (13b or 13c) holes and electrons injected from each electrode in Step (i); and (iii) causing excitons generated by the recombination of holes and electrons to return to the ground state.

That is, when the excitons return to the ground state in the above-mentioned Step (iii), light is emitted.

Next, components of the organic EL display device 1 illustrated in FIGS. 1A and 1B are described in detail.

In a top emission type organic EL display device, it is preferred that the first electrode 11a (11b or 11c) be a reflective electrode. Here, as a constituent material of the reflective electrode, a material which is conductive and has a high reflectance (visible light reflectance of 60% or more) is used. For example, a metal material such as silver or aluminum is used. Note that, the reflective electrode may be a laminated electrode formed by laminating a layer formed of a metal material including silver or aluminum as a main component and a layer formed of a transparent conductive material such as a indium tin oxide (ITO) or indium zinc oxide. Further, in the organic EL display device 1 illustrated in FIGS. 1A and 1B, the first electrode 11a (11b or 11c) functions as an electrode (anode) which is individually provided with respect to each element.

The hole transport layer 12a (12b or 12c) plays a role of transporting to the emission layer 13a (13b or 13c) holes injected from the anode (first electrode 11a (11b or 11c)). Note that, as necessary, a hole injection layer formed of copper phthalocyanine, vanadium oxide, or the like may be provided as an interposed layer between the first electrode 11a (11b or 11c) as the anode and the hole transport layer 12a (12b or 12c). Further, as necessary, an electron blocking layer formed of a material having a small absolute value of the lowest unoccupied molecular orbital (LUMO) energy may be provided as an interposed layer between the hole transport layer 12a (12b or 12c) and the emission layer 13a (13b or 13c).

Exemplary low-molecular and high-molecular materials having the function of injecting and transporting holes include a triphenyldiamine derivative, an oxadiazole derivative, a porphyrin derivative, a stilbene derivative, poly(vinylcarbazole), poly(thiophene), and other conductive high polymers. However, the present invention is not limited thereto.

As a constituent material of the emission layer 13a (13b or 13c), a publicly known luminescence material may be suitably used. Note that, the emission layer 13a (13b or 13c) may be a layer formed only of a luminescence material, or may be a layer formed of a host and a dopant (an emission dopant, a charge transport dopant, or the like).

As a constituent material of the electron transport layer 14a (14b or 14c), a publicly known material, for example, a phenanthroline compound may be used. Note that, as necessary, a hole blocking layer formed of a material having a large absolute value of the highest occupied molecular orbital (HOMO) energy may be formed as an interposed layer between the emission layer 13a (13b or 13c) and the electron transport layer 14a (14b or 14c).

According to the present invention, each of constituent materials of the hole transport layer 12a (12b or 12c), the emission layer 13a (13b or 13c), and the electron transport layer 14a (14b or 14c) which form the organic compound layer (2a, 2b, or 2c) is a material the polarity of which is weak and which is insoluble in water.

In the organic EL display device 1 illustrated in FIGS. 1A and 1B, the electron injection layer 15 is a thin film layer containing an alkali metal or an alkaline-earth metal and having a thickness of 10 Å to 1000 Å.

By the way, in the electron injection layer 15, in order to improve the efficiency of injecting electrons from a cathode, it is preferred that a metal having a low work function or a compound thereof be contained in the electron injection layer 15 in the form of a dopant or the like. It is preferred that the metal having a low work function be an alkali metal or an alkaline-earth metal. Further, an alkali metal compound is more preferred because the handling thereof in the atmosphere is comparatively easy. It is preferred that the alkali metal compound to be used as a constituent material of the electron injection layer 15 be a cesium compound. Among cesium compounds, cesium carbonate is stable in the atmosphere and the handling thereof is easy, and in addition, the drive voltage of the organic EL element may be suppressed as low as about 5 V, and thus, cesium carbonate is particularly preferred.

On the other hand, exemplary preferred alkali metal compounds other than a cesium compound include lithium fluoride (LiF) and potassium fluoride (KF). As an electron injection layer containing an alkaline-earth metal, calcium, a magnesium alloy, or the like is suitably used.

Further, when the electron injection layer 15 is a layer which is formed by mixing an organic compound as a host and an alkali metal or an alkaline-earth metal which is a donor (electron donative) dopant, the thickness of the layer itself may be caused to be thick. Here, it is preferred that the organic compound as the host be a material which transports electrons. Here, as the material which transports electrons, a publicly known material may be used. For example, an aluminum quinolinol complex or a phenanthroline compound may be used.

In a top emission type organic EL display device, the second electrode 16 (cathode) is an electrode which transmits light, more specifically, is a translucent electrode or a transparent electrode. The word "transparent" as used herein means that the visible light transmittance thereof is 80% or more, and the word "translucent" as used herein means that the visible light transmittance thereof is 20% or more and less than 80%. A translucent electrode is formed by forming a thin film of a metal material so as to have a thickness of 5 nm or more and less than 40 nm. Exemplary metal materials as a constituent material of the translucent electrode include single-component metals such as gold, platinum, silver, aluminum, chromium, and magnesium and alloys which are combinations of multiple kinds thereof. Among them, silver having a high conductivity and a high reflectance or a silver alloy is particularly preferred. Further, by setting the thickness of the translucent electrode so as to be 5 nm or more and less than 40 nm, a reflectance which is sufficient for the translucent electrode to function as a resonator structure may be obtained. On the other hand, loss of light due to absorption with regard to wavelengths of blue light emitted by EL (having a peak wavelength of about 460 nm) may be suppressed to obtain satisfactory light taking out efficiency. Further, when a transparent electrode is adopted as the second electrode 16, a film formed of a transparent conductive material such as indium tin oxide or indium zinc oxide or a film which is a laminate thereof may be used.

By the way, the organic EL display device 1 illustrated in FIGS. 1A and 1B adopts a structure in which the electron injection layer 15 and the second electrode 16 are laminated in the stated order as a member/layer structure for injecting electrons toward the emission layer 13a (13b or 13c). However, according to the present invention, the member/layer structure for injecting electrons toward the emission layer 13a (13b or 13c) is not limited to the laminate of the electron injection layer 15 and the second electrode 16. For example, a single layer which has both the function of the electron injection layer and the function of the second electrode 16 may be adopted instead of the above-mentioned laminate. Note that, when such a single layer is adopted, in order to cause the single layer to exert the function of injecting electrons, an alkali metal or an alkaline-earth metal is contained in the single layer.

Next, the method of manufacturing an organic EL display device according to the present invention is described. As described above, the method of manufacturing an organic EL display device according to the present invention includes the following steps (A) to (E).

(A) the step of forming on a substrate having the first electrode provided thereon an organic compound layer which is insoluble in water (B) the step of providing a mask layer containing a water-soluble material in a part of a region in which the organic compound layer is formed (C) the step of removing a part of the organic compound layer that is formed in a region in which the mask layer is not provided (D) the step of removing the mask layer (E) the step of forming, after the removing of the mask layer, a layer containing one of an alkali metal and an alkaline-earth metal The steps are described in the following with appropriate reference to the attached drawings. FIGS. 2A to 2I are schematic sectional views illustrating a method of manufacturing an organic EL display device according to a first embodiment of the present invention. Note that, the embodiment illustrated in FIGS. 2A to 2I illustrates steps for manufacturing the organic EL display device 1 illustrated in FIGS. 1A and 1B.

(1) Step of Forming First Electrode

First, the first electrode (reflective electrode) 11a (11b or 11c) is patterned on the substrate 10. The patterning may be carried out by a publicly known method. Note that, when a substrate with electrodes in which the first electrodes 11a (11b and 11c) are provided in advance on the substrate 10 may be prepared, this step may be omitted.

(2) Step of Forming Organic Compound Layer (Step (A))

Figure 2A:
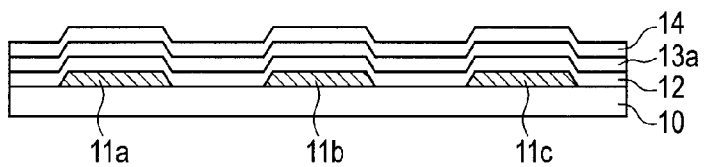
FIGS. 2A, 2B, 2C, 2D, 2E, 2F, 2G, 2H, and 2I are schematic sectional views illustrating a method of manufacturing an organic EL display device according to a first embodiment of the present invention.

Next, the organic compound layer is formed on the substrate 10 having the first electrode 11a (11b or 11c) provided thereon. According to the present invention, the method of forming the organic compound layer is not specifically limited, but is preferably a method in which the organic compound layer is formed in a vacuum atmosphere. In the method of forming the organic compound layer, specifically, the hole transport layer 12, the blue emission layer 13a, and the electron transport layer 14 are sequentially formed in an entire display region on the substrate 10 having the first electrode 11a (11b or 11c) provided thereon (FIG. 2A). Here, constituent materials of the hole transport layer 12, the blue emission layer 13a, and the electron transport layer 14 are, as described above, materials the polarities of which are weak and which are insoluble in water. The materials are selected in this way, and hence the organic compound layer is prevented from being dissolved in water to be used in a subsequent step.

(3) Step of Forming Mask Layer (Step (B))

Then, a mask layer 20 for patterning is provided. The mask layer 20 is used as a mask when the organic compound layer is patterned, and the layer structure thereof differs depending on the method of patterning the organic compound layer.

Here, exemplary methods of patterning the organic compound layer include photolithography, an ink jet method, and laser patterning. However, according to the present invention, the method of patterning the organic compound layer is not limited thereto. A case where photolithography is adopted is described in the following. Note that, methods in which the ink jet method or laser patterning is adopted are described in detail with reference to examples.

Figure 2B:
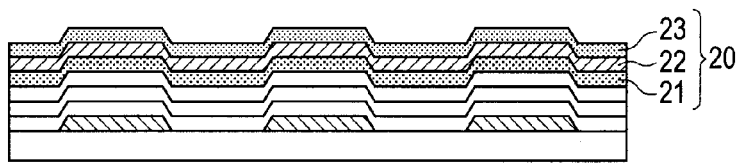
Figure 2C:
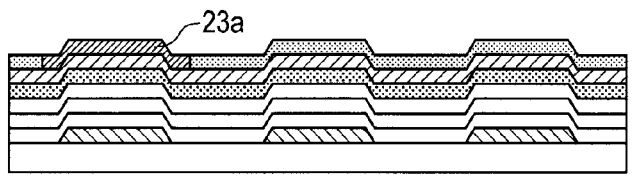
Figure 2D:
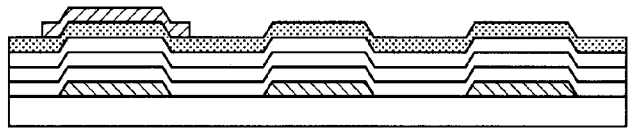

When photolithography is adopted, it is preferred that the mask layer 20 be formed by laminating two kinds of mask layers. More specifically, a first mask layer 21, a second mask layer 22, and further, a resist layer 23 for the patterning are laminated in the stated order from a side which is nearer to the organic compound layer (FIG. 2B). However, the layer structure of the mask layer 20 is not limited to the two-layer structure of the first mask layer 21 and the second mask layer 22. For example, a single-layer structure in which the first mask layer 21 is omitted is also possible.

(3-1) Step of Forming First Mask Layer and Second Mask Layer

Here, the first mask layer 21 is a layer formed of a water-soluble material. The water-soluble material which forms the first mask layer 21 is not specifically limited insofar as the water-soluble material is a material which is water-soluble and which may be easily formed and removed. For example, a water-soluble high-molecular material such as polyvinyl pyrrolidone (PVP), polyvinyl alcohol (PVA), or polyethylene glycol (PEG) or an inorganic water-soluble material such as lithium fluoride is suitably used.

Further, the method of forming the first mask layer 21 is not specifically limited, but, when a water-soluble high-molecular material is used, a wet film forming method such as an applying method is preferred, and on the other hand, when an inorganic water-soluble material is used, a film forming method which is carried out in a vacuum atmosphere such as vapor deposition is preferred.

The second mask layer 22 is a layer formed of a material which is insoluble in resist liquids (photoresist solvent, photoresist developer, and photoresist remover), and, more specifically, a layer formed of an inorganic material such as silicon nitride or silicon oxide. Here, it is sufficient that the second mask layer 22 may protect the organic compound layer and the like thereunder from a developer when patterning is carried out by photolithography, and it does not matter if oxygen or hydrogen is contained in the film.

Further, the method of forming the second mask layer 22 is not specifically limited, but, a film forming method which is carried out in a vacuum atmosphere such as vapor deposition is preferred. Then, the films from the organic compound layer to the second mask layer 22 may be continuously formed in a vacuum atmosphere, and, if such continuous film formation may be carried out, the manufacturing steps may be simplified, which is advantageous.

By the way, when the mask layer is patterned by photolithography, it is desired that the first mask layer 21 and the second mask layer 22 be once formed in an entire emission region.

(3-2) Step of Forming Resist Layer

After the above-mentioned first mask layer 21 and second mask layer 22 are formed sequentially, the resist layer 23 in a predetermined pattern is formed on the second mask layer 22 (FIG. 2B). Here, by forming the second mask layer 22 on the organic compound layer (hole transport layer 12, blue emission layer 13a, and electron transport layer 14) before the resist layer 23 is provided, the organic compound layer may be prevented from being dissolved or deformed by a resist liquid. The step of forming the mask layer 20 in the predetermined pattern using photolithography includes, for example, the following steps.

(3-2-1) a step of exposing the resist layer 23 (FIG. 2C)
(3-2-2) a step of selectively removing the resist layer 23
Step (3-2-1) is, for example, when a negative resist is used, a step of selectively exposing a region (23a) specified as blue organic EL elements.

The step (3-2-2) is carried out by, for example, a method using a resist developer or dry etching using an oxygen gas. However, the present invention is not limited thereto.

(3-3) Step of Processing Mask Layer

Then, by processing the laminate of the first mask layer 21 and the second mask layer 22 with the patterned resist layer being the mask, the mask layer 20 is formed in a part of the region in which the organic compound layer is formed. The mask layer is processed as, for example, in the following steps.

(3-3-1) a step of processing (selectively removing) the second mask layer 22 (FIG. 2D)
(3-3-2) a step of processing (selectively removing) the first mask layer 21

Step (3-3-1) may be carried out by publicly known dry etching with the resist layer 23 formed in the predetermined pattern being the mask. Note that, when the second mask layer 22 is an oxide film or a nitride film formed of, for example, silicon nitride or silicon oxide, it is preferred that dry etching using a fluorine-based gas such as a carbon tetrafluoride gas ($CF_4$ gas) be carried out. When formation of the second mask layer 22 is omitted when the mask layer 20 is formed, it is not necessary to carry out this step.

In Step (3-3-2), for example, dry etching using an oxygen gas with the resist layer 23 formed in the predetermined pattern and the second mask layer 22 being the mask may be adopted. Note that, when formation of the first mask layer 21 is omitted when the mask layer 20 is formed, it is not necessary to carry out this step.

(4) Step of Removing Part of Organic Compound Layer (Blue Organic Compound Layer 2a) which is Formed in Region in which Mask Layer is not Provided (Step (C))

Next, a part of the organic compound layer which is formed in a region in which the mask layer is not provided is selectively removed.

In the step of removing the organic compound layer, for example, with the mask layer 20 formed in the predetermined pattern through above-mentioned Steps (3-2) through (3-3) being the mask, similarly to Step (3-3-2), publicly known dry etching is adopted to process the organic compound layer.

Figure 2E:
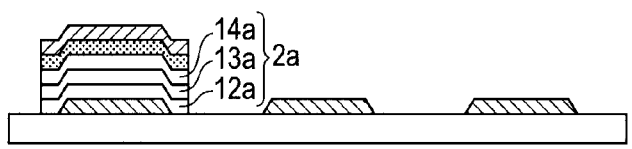

By carrying out above-mentioned Steps (3-2) through (3-3) and Step (4), as illustrated in FIG. 2E, the blue organic compound layer 2a may be formed only in a predetermined region, that is, a region specified as a blue pixel portion. Note that, at the stage at which Step (4) is finished, the first mask layer 21 and the second mask layer 22 provided on the organic compound layer (blue organic compound layer 2a) are left without being removed, and are used to protect the organic compound layer (blue organic compound layer 2a) in steps of forming other colors of the organic compound layer.

(5) Step of Forming and Processing Organic Compound Layer (Green Organic Compound Layer 2b)

Next, the organic compound layer (green organic compound layer 2b) is formed in a region specified as a green pixel portion. First, the organic compound layer (green organic compound layer 2b) including the hole transport layer, the emission layer (13b), and the electron transport layer is formed in the entire emission region. Then, through steps similar to above-mentioned Steps (3-2) through (3-3) and Step (4), the green organic compound layer 2b may be selectively formed in a predetermined region, that is, the region specified as a green pixel portion. Note that, in this step, when the organic compound layer (green organic compound layer 2b) is processed, it is necessary to remove at least the organic compound layer in a region specified as a red pixel portion.

(6) Step of Forming and Processing Organic Compound Layer (Red Organic Compound Layer 2c)

Next, the organic compound layer (red organic compound layer 2c) is formed in a region specified as a red pixel portion. First, the organic compound layer (red organic compound layer 2c) including the hole transport layer, the emission layer (13c), and the electron transport layer is formed in the entire emission region. Then, through steps similar to above-mentioned Steps (3-2) through (3-3) and Step (4), the red organic compound layer 2c may be selectively formed only in a predetermined region, that is, the region specified as a red pixel portion.

Figure 2F:
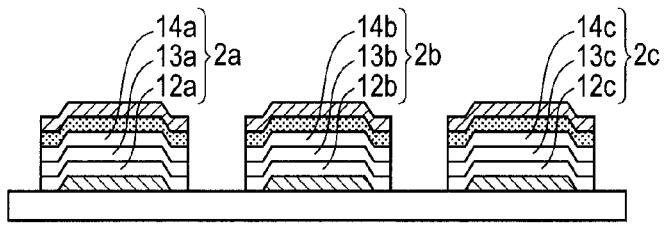

Through the above-mentioned steps, in the predetermined regions (regions corresponding to blue, green, and red pixels, respectively), the organic compound layers (2a, 2b, and 2c) of the respective colors are selectively formed (FIG. 2F). Note that, in Steps (4) through (6), the description is made with regard to a case where the blue, green, and red organic compound layers are formed in the stated order. However, according to the present invention, the order of forming the organic compound layers is not limited to the stated order.

In conventional vapor deposition using a metal mask, it is necessary to provide an interval of several tens of micrometers between EL elements taking into consideration the strength of the mask and the accuracy of the process such as alignment. However, as described above, when the organic compound layer is patterned using photolithography, depending on the performance of the mask exposure apparatus and the like, the organic compound layers may be patterned with high accuracy having a resolution of several tens of micrometers or finer even when the mask exposure apparatus is an ordinary one. Therefore, the interval between EL elements may be set to be less than 10 μm, and, compared with a case of a conventional method using a fine metal mask, a finer organic EL display device may be manufactured.

(7) Step of Removing Mask Layer

Figure 2G:
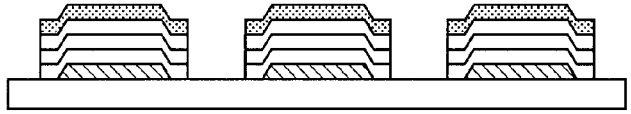
Figure 2H:
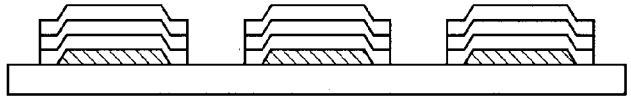

Next, a step of removing the mask layer is carried out. Here, when the second mask layer 22 is removed, for example, dry etching is used. If the second mask layer 22 is a thin film formed of silicon nitride, dry etching by $CF_4$ may be used (FIG. 2G). Further, when the first mask layer 21 formed of a water-soluble material is removed, the removal may be carried out by immersion in water (FIG. 2H). Here, the organic compound layer such as the emission layer and the electron transport layer is insoluble in water. Further, the molecular structures of the constituent materials of the organic compound layer do not change only by immersion in water. Therefore, after the immersion of the first mask layer 21 in water to carry out the removal, by drying the organic compound layer in the subsequent step to remove moisture which adheres to a front surface or side surfaces of the organic compound layer, the EL characteristics of the organic compound layer are not lost.

(8) Step of Drying Organic Compound Layer

Next, the organic compound layer is dried to remove moisture which adheres to the front surface or the side surfaces of the organic compound layer as much as possible. The step of forming a common layer which is subsequent to this step is a step in a vacuum. Here, in order to prevent readhesion of moisture between this step and the subsequent step (step of forming the common layer), in this step, the substrate having the organic compound layer is heated in a vacuum to remove moisture which adheres to the front surface or the side surfaces of the organic compound layer. Then, with the vacuum state being maintained, the substrate is transferred to a film forming chamber for forming the common layer.

Here, if a chamber for carrying out a step of drying the organic compound layer (drying chamber) and the chamber for carrying out the step of forming the common layer (film forming chamber) are coupled to each other in a state of spatially closed with a transfer chamber or the like provided therebetween, it is easy to transfer the substrate with the vacuum state being maintained. Further, even if the chamber for carrying out the step of drying the organic compound layer and the chamber for carrying out the step of forming the common layer are not coupled to each other in a state of spatially closed, similar effects may be obtained by moving the substrate between the chambers using a transfer box which may be evacuated.

Note that, the word "vacuum" as used herein means a pressure which may be obtained using a simple vacuum pump, and more specifically, a pressure which is $1 \times 10^{-3}$ Pa or lower. By reducing the pressure to $1 \times 10^{-3}$ Pa or lower, moisture which is taken into the organic compound layer again after the moisture adsorbed into the organic compound layer is removed from the inside of the layer in the above-mentioned drying step may be reduced. Further, by reducing the pressure to $10^{-3}$ Pa or lower and carrying out coupling to a vacuum chamber or using a transfer box, adhesion of foreign matters on the organic compound layer after the above-mentioned drying step may be reduced.

In this step, the range of the heating temperature when moisture which adheres to the front surface or the like of the organic compound layer is removed is from the glass transition temperature of the organic material which forms the organic compound layer as an upper limit to 50° C. as a lower limit. Here, if the heating temperature exceeds the glass transition temperature of the organic material, the quality of the organic compound layer is altered and desired element characteristics cannot be obtained. On the other hand, if the heating temperature is lower than 50° C., the dewatering effect may not be obtained. Further, it is preferred that the substrate be transferred in closed space also during the step after the step of removing the mask layer by performing a step of water-washing the layer formed of a water-soluble material which is a part of the mask layer before the step of drying the organic compound layer. Then, adhesion of foreign matters may be avoided with more reliability.

(9) Step of Forming Common Layer

Figure 2I:
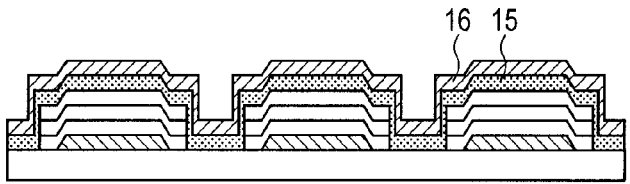

Next, a common layer 15 is formed on the organic compound layer (FIG. 2I). The words "common layer" as used herein mean a layer which is not patterned using a mask layer as in photolithography, and means a layer which is continuously formed over multiple organic EL elements. Specific examples of the common layer 15 include a layer containing an alkali metal or an alkaline-earth metal (electron injection layer). Here, the words "layer containing an alkali metal" as used herein mean that an alkali metal in the form of a single-component metal, a component of an alloy, a compound such as an oxide or a halide, or ions is contained in the layer concerned (common layer 15). Further, the words "layer containing an alkaline-earth metal" as used herein mean that an alkaline-earth metal in the form of a single-component metal, a component of an alloy, a compound such as an oxide or a halide, or ions is contained in the layer concerned (common layer 15). In the following, a specific method of forming the common layer 15 which contains an alkali metal compound as the layer containing an alkali metal or an alkaline-earth metal is described.

The layer containing an alkali metal compound is formed by, for example, vacuum film formation. Here, the layer containing an alkali metal compound is, more specifically, a layer containing an alkali metal compound and having the function of injecting/transporting electrons which comes from the alkali metal ions. Further, a layer having the function of injecting/transporting electrons is, for example, an electron injection layer or a cathode (second electrode). When an alkali metal compound is contained in the electron injection layer, the electron injection layer may be formed only of the alkali metal compound, or may be formed of the alkali metal compound and an organic compound which injects and transports electrons.

Further, when an alkali metal compound is contained in the cathode, the cathode is a thin film which is formed of the alkali metal compound and another metal material, for example, a material having a high conductivity and a low light absorption ratio such as Ag or Al. The same can be said with regard to the layer containing an alkaline-earth metal.

(10) Step of Forming Second Electrode

After the layer containing an alkali metal or an alkaline-earth metal is formed, the second electrode is formed. When the second electrode is a cathode and the alkali metal or the alkaline-earth metal functions as the cathode, it is not necessary to form the second electrode and this step may be omitted. In the organic EL display device 1 illustrated in FIGS. 1A and 1B, the common layer (electron injection layer) and the second electrode 16 (transparent electrode, cathode) which is formed of a transparent conductive material are provided in the stated order on the organic compound layer (12, 13, and 14). In the organic EL display device 1 illustrated in FIGS. 1A and 1B, an alkali metal compound is contained in the common layer 15. Note that, in the organic EL display device 1 illustrated in FIGS. 1A and 1B, the common layer 15 and the second electrode 16 are layers common to all the pixels provided on the substrate, but the present invention is not limited thereto. For example, the electron injection layer and the second electrode 16 may be individually formed with respect to each of multiple pixel groups formed by grouping the pixels.

After the common layer 15 (electron injection layer) and the second electrode 16 are formed, an encapsulating step of providing an encapsulating member for protecting against moisture or the like the emission region in which the pixels are provided in a vacuum atmosphere or in an atmosphere in which the amount of moisture is limited.

By the way, in the step of forming the layer including an alkali metal compound, because the step is carried out in a vacuum, the common layer 15 (electron injection layer) and the second electrode 16 (cathode) formed in this step are not exposed to water. Further, the encapsulating step after that step is also carried out in an atmosphere in which the amount of moisture is limited, and thus, the organic EL element may be formed on each of the pixels without losing the electron injection characteristics.

By the way, in Step (5) (the step of processing the organic compound layer (green organic compound layer)), laser patterning may be used instead of photolithography. Here, laser patterning is a method in which a mask layer formed of, for example, lithium fluoride is provided, laser is applied to a region other than a region in which the mask layer is provided (pixel region portion), and the organic compound layer formed in the region to which laser is applied is removed to carry out patterning. Even when laser patterning is used, patterning of a resolution which is comparable to that of an ordinary mask exposure apparatus may be carried out. Therefore, compared with a case where a conventional fine metal mask is used, a finer organic EL display device may be materialized.

Further, in Step (5), the ink jet method may be used instead of photolithography. Here, the ink jet method is a method in which, when a mask layer is formed, ink is jetted to form a mask layer formed of a water-soluble material only in a predetermined pixel region portion. Note that, the organic compound layer may be processed in a method similar to photolithography. Even when the ink jet method is used, similarly to the case of photolithography or laser patterning, patterning of a resolution of an ordinary mask exposure apparatus may be carried out. Further, by using the ink jet method, an effect may be enjoyed that patterning of a large area may be carried out with a smaller number of steps.

EXAMPLE 1

Figure 3:
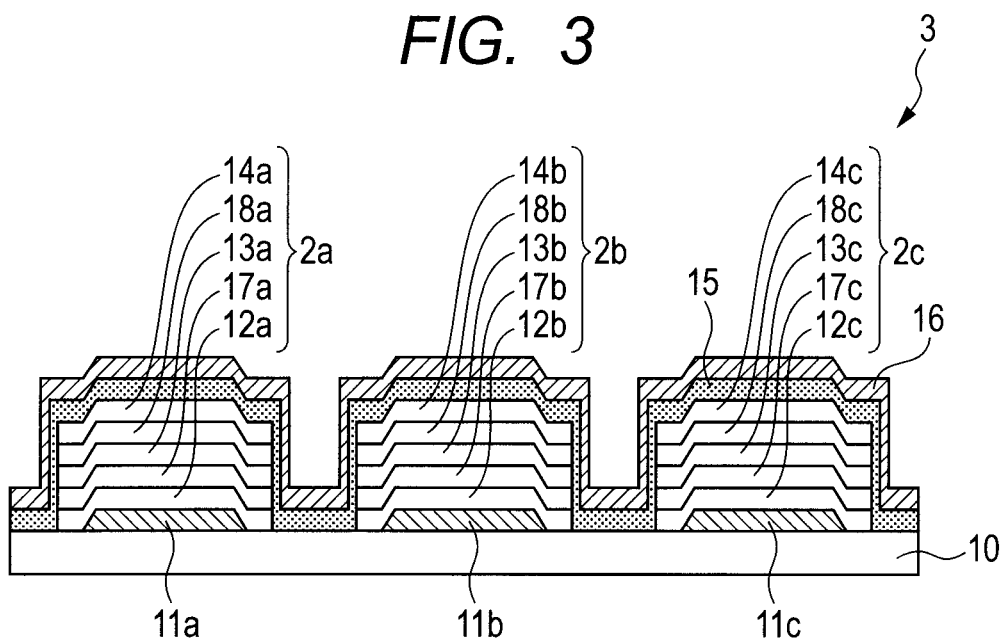
FIG. 3 is a schematic sectional view illustrating an organic EL display device which was manufactured in Example 1.

An organic EL display device 3 illustrated in FIG. 3 was manufactured according to manufacturing steps described in the following. Note that, in the organic EL display device 3 illustrated in FIG. 3, an electron blocking layer (17a, 17b, or 17c) is provided as an interposed layer between the hole transport layer (12a, 12b, or 12c) and the emission layer (13a, 13b, or 13c) in the organic EL display device 1 illustrated in FIGS. 1A and 1B. Further, a hole blocking layer (18a, 18b, or 18c) is provided as an interposed layer between the emission layer (13a, 13b, or 13c) and the electron transport layer (14a, 14b, or 14c). More specifically, each of the organic compound layers (2a, 2b, and 2c) is a laminate formed by laminating the hole transport layer, the electron blocking layer, the emission layer, the hole blocking layer, and the electron transport layer in the stated order. The basic flow of the manufacturing steps is the same as those illustrated in FIGS. 2A to 2I. Here, part of materials used in this example are expressed in the following:

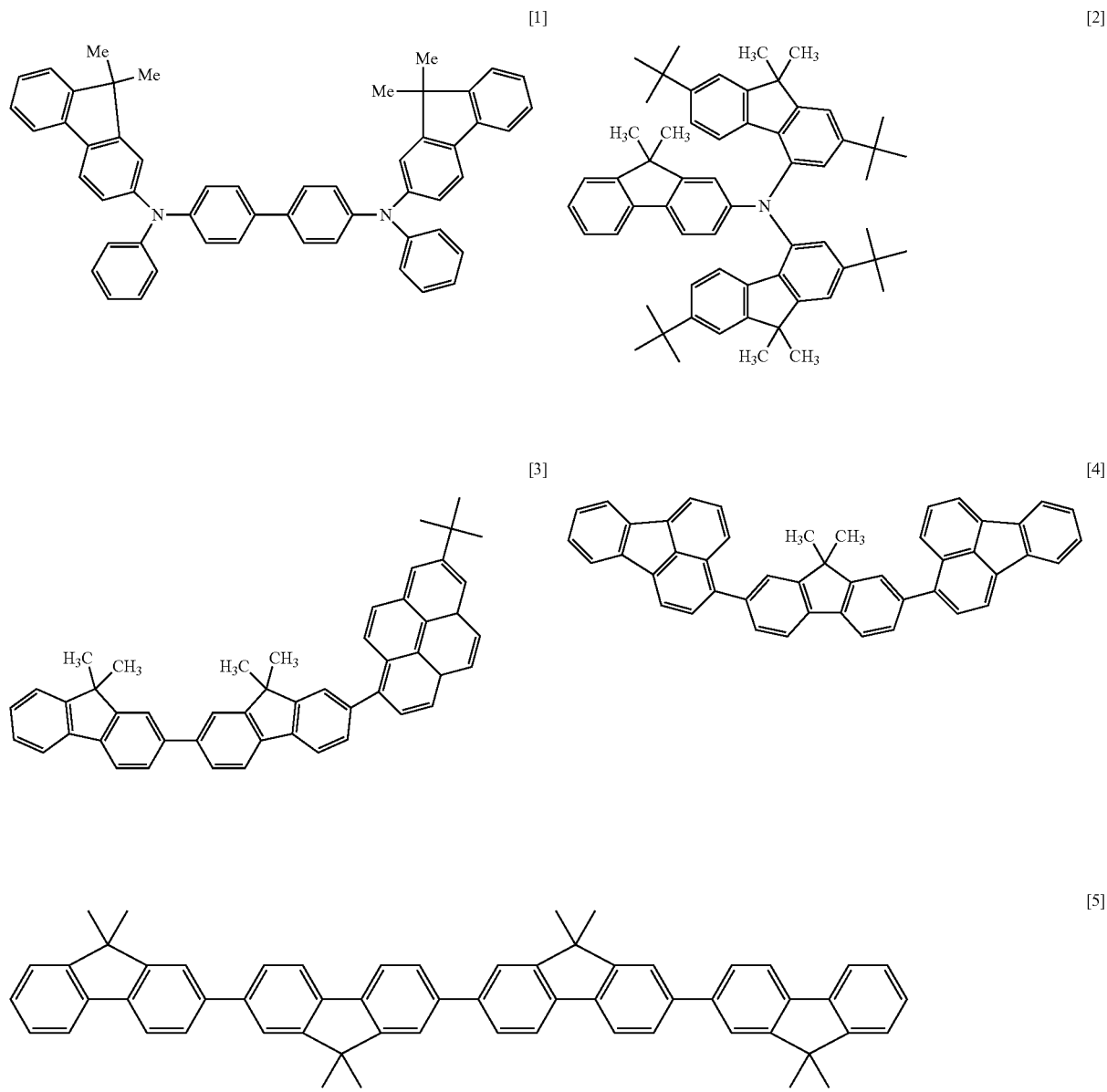

-continued

[6]

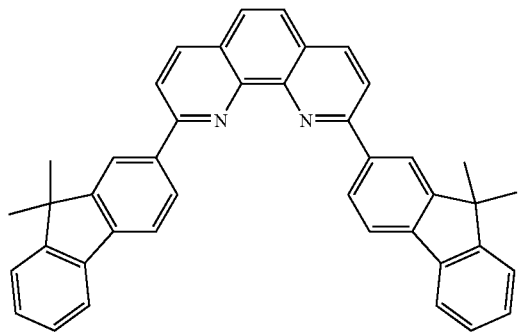

(1) Step of Forming First Electrode

By sputtering, a film of an aluminum alloy (AlNd) was formed as a reflective electrode 11 on a glass substrate (substrate 10). Here, the thickness of the aluminum alloy film was 100 nm. Then, by sputtering, an ITO film was formed. Here, the thickness of the ITO film was 10 nm. Note that, a laminate of the aluminum alloy film and the ITO film functioned as the first electrode (11a, 11b, or 11c).

Then, by resist patterning, the laminate was processed to form the first electrode (11a, 11b, or 11c) in a predetermined region corresponding to a pixel portion. Each of the first electrodes was in the shape of a rectangle of 11 μm×3 μm, and the first electrodes were arranged with a pitch in a long side direction of the first electrodes being 12 μm and a pitch in a short side direction thereof being 4 μm. The word "pitch" as used herein means an interval between center lines of the first electrodes, and is equal to the size of a sub-pixel. Here, an interval of 1 μm was provided between the first electrodes. Further, UV/ozone cleaning of the surface of the substrate was carried out.

(2) Step of Forming Organic Compound Layer (Blue Organic Compound Layer 2a)

Next, vacuum deposition was used to form a film of the hole transport material expressed by Formula [1] on the first electrode (11a, 11b, or 11c), thereby forming the hole transport layer 12. Here, the thickness of the hole transport layer 12 was 110 nm. Then, a film of the hole transport (electron blocking) material expressed by Formula [2] was formed to form the electron blocking layer 17. Here, the thickness of the electron blocking layer 17 was 10 nm. Then, the host expressed by Formula [3] and the guest expressed by Formula [4] were co-evaporated so that the mass ratio thereof was 95:5 to form the emission layer 13. Here, the thickness of the emission layer 13 was 25 nm. Then, a film of the electron transport (hole blocking) material expressed by Formula [5] was formed on the emission layer 13, thereby forming the hole blocking layer 18. Here, the thickness of the hole blocking layer 18 was 10 nm. Then, a film of a phenanthroline compound expressed by Formula [6] was formed on the hole blocking layer 18, thereby forming the electron transport layer 14. Here, the thickness of the electron transport layer 14 was 10 nm.

(3) Step of Forming First Mask Layer and Second Mask Layer

Then, after an aqueous solution of 5 wt % polyvinyl pyrrolidone (PVP) was applied onto the electron transport layer 14 by spin coating in the atmosphere, moisture was vaporized on a hot plate at 110° C. to form a PVP film. Here, the thickness of the PVP film was 500 nm. Note that, the PVP film functioned as the first mask layer (21). Then, by chemical vapor deposition in a vacuum chamber, a film of silicon nitride (SiN film) was formed on the first mask layer (21). Here, the thickness of the SiN film was 1 μm. Note that, as a reactant gas in the above-mentioned chemical vapor deposition, a gas mixture of $SiH_4$, hydrogen, and nitrogen was used. Further, the SiN film functioned as the second mask layer 22.

(4) Step of Forming Resist Layer

Next, a photoresist (positive) was spin coated to form the resist layer 23.

(5) Step of Forming Mask Layer

Then, after the resist layer 23 thus formed was prebaked, a photomask according to the pixel pattern was used to carry out exposure, development, and postbake. Here, the resist layer was patterned so as to be left in a size of 1,200 μm×4 μm over first electrodes of multiple blue organic EL elements arranged in the long side direction of the first electrodes including regions in which the first electrodes were provided. Here, the sub-pixel size was 12 μm×4 μm.

Next, with use of the remaining photoresist as a mask, silicon nitride was etched by dry etching using $CF_4$. Then, an oxygen gas was used to carry out dry etching of the PVP film. Here, the remaining resist was also removed at the same time by the oxygen gas used in the etching.

(6) Step of Processing Organic Compound Layer (Blue Organic Compound Layer 2a)

Then, with use of the remaining silicon nitride film (second mask layer 22) as a mask, dry etching of the organic compound layer was carried out using an oxygen gas to selectively form the blue organic compound layer 2a only in a portion corresponding to the blue pixel.

(7) Step of Forming and Processing Organic Compound Layer (Green Organic Compound Layer 2b)

Next, under a state in which an organic material contained in the emission layer 13 (13b) was set to a material optimum for green, a film forming step and a patterning step were carried out in a way similar to the case of the blue organic compound layer. In this manner, the green organic compound layer 2b was selectively formed on the first electrode 11b.

(8) Step of Forming and Processing Organic Compound Layer (Red Organic Compound Layer 2c)

Next, under a state in which an organic material contained in the emission layer 13 (13c) was set to a material optimum for red, a film forming step and a patterning step were carried out in a way similar to the case of the blue organic compound layer. In this manner, the red organic compound layer 2c was selectively formed on the first electrode 11c. Thus, the organic compound layers for three colors of blue, green, and red were formed in predetermined regions on the pixels (predetermined first electrodes).

(9) Step of Removing Mask Layer

Next, by dry etching of the entire substrate using a $CF_4$ gas, the second mask layer 22 provided on the organic compound layer (2a, 2b, and 2c) was removed. Then, the entire substrate was immersed in water to remove the first mask layer (21).

(10) Step of Drying Organic Compound Layer

Figure 4:
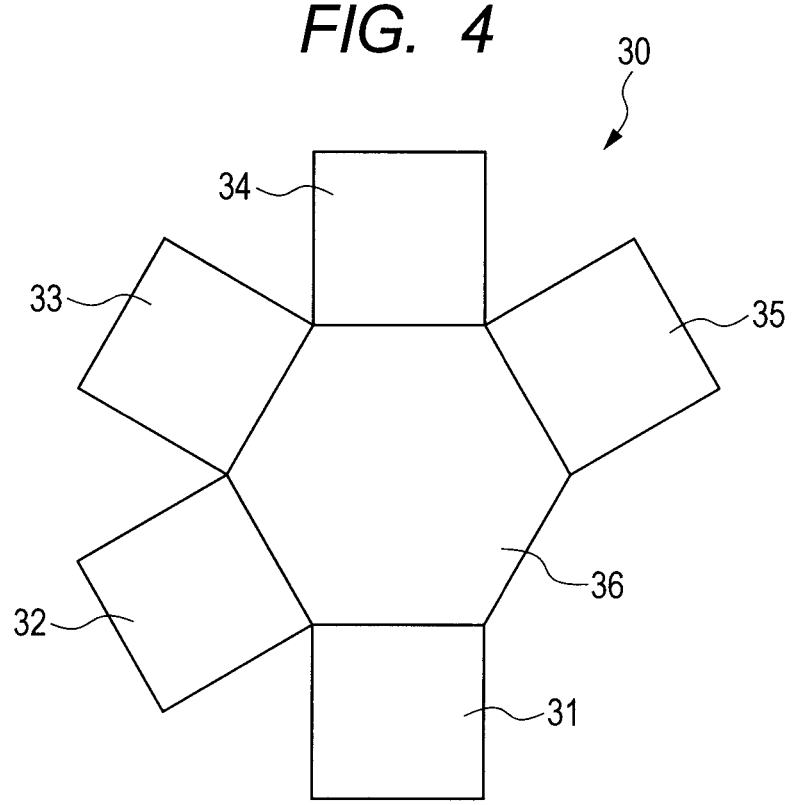
FIG. 4 is a schematic view illustrating a part of the organic EL display device which was used in Example 1.

Next, an apparatus 30 illustrated in FIG. 4 was used to carry out the step of drying the organic compound layer and the subsequent steps. Note that, in the apparatus 30 illustrated in FIG. 4, each of the chambers coupled to a transfer chamber 36 (a delivery chamber 31, a drying chamber 32, a first film forming chamber 33, a second film forming chamber 34, and an encapsulation operation chamber 35) may be evacuated using a vacuum pump (not shown). Therefore, the substrate 10 may be freely moved through the transfer chamber 36 between the other chambers while maintaining the vacuum atmosphere.

First, the substrate 10 was introduced into the delivery chamber 31 illustrated in FIG. 4. Note that, at the time when the substrate 10 was introduced into the delivery chamber 31, the delivery chamber 31 was vented to atmospheric pressure. Then, each of the chambers which form the apparatus 30 including the delivery chamber 31 (the drying chamber 32, the first film forming chamber 33, the second film forming chamber 34, the encapsulation operation chamber 35, and the transfer chamber 36) was evacuated. Then, a gate valve (not shown) was released to move the substrate 10 from the delivery chamber 31 via the transfer chamber 36 to the drying chamber 32. Then, in the drying chamber 32, the substrate 10 was heated at a temperature which is lower than the glass transition temperature of the organic material which forms the organic compound layer (110° C.) by heating means (not shown) provided in the drying chamber, to thereby remove moisture which adheres to the organic compound layer.

(11) Step of Forming Layer Containing Alkali Metal or Alkaline-Earth Metal (Common Layer)

Then, after the substrate 10 was transferred via the transfer chamber 36 to the first film forming chamber 33, a phenanthroline compound expressed by Formula [6] and cesium carbonate were co-evaporated so that the cesium concentration in the layer was 8.3 wt %, thereby forming the electron injection layer. Here, the thickness of the electron injection layer was 15 nm. Note that, in this example, the electron injection layer functioned as the common layer 15.

(12) Step of Forming Second Electrode

Then, after the substrate 10 was transferred via the transfer chamber 36 to the second film forming chamber 34, a film of silver (Ag) was formed on the electron injection layer 15 by thermal evaporation, thereby forming the translucent second electrode 16. Here, the thickness of the second electrode 16 was 16 nm.

(13) Encapsulating Step

Then, after the substrate 10 was transferred via the transfer chamber 36 to the encapsulation operation chamber 35, encapsulating glass (not shown) was adhered to the substrate under a nitrogen atmosphere to form a structure in which deterioration of the element was prevented. As described above, the organic EL display device was manufactured.

(14) Evaluation of Organic EL Display Device

An image was displayed on the obtained organic EL display device. The obtained current efficiency was 14 cd/A with regard to red, 45 cd/A with regard to blue, and 3.5 cd/A with regard to green. Those values were comparable to values in a case where vapor deposition using a fine metal mask was carried out in a vacuum to continuously form a film. On the other hand, with regard to the fineness, while the pixel size in a case where vapor deposition using a fine metal mask was carried out was about 100 microns, a pixel size of 12 microns could be obtained in this example. Further, in this example, the mask layer had a two-layer structure of PVP and silicon nitride, and it is easy to increase the thicknesses of both of the layers. Therefore, a process which is robust against foreign matters and defects generated during the process and which is stable may be developed. Further, even when moisture is adsorbed in the step of processing the organic compound layer, it is sufficient that the series of steps from the step of drying the organic compound layer to the step of forming the common layer be carried out in a vacuum. This enables prevention of readhesion of moisture to the organic compound layer and obtainment of emission characteristics which are comparable to those of an organic EL display device formed by pattern film formation using a metal mask.

EXAMPLE 2

Figure 5:
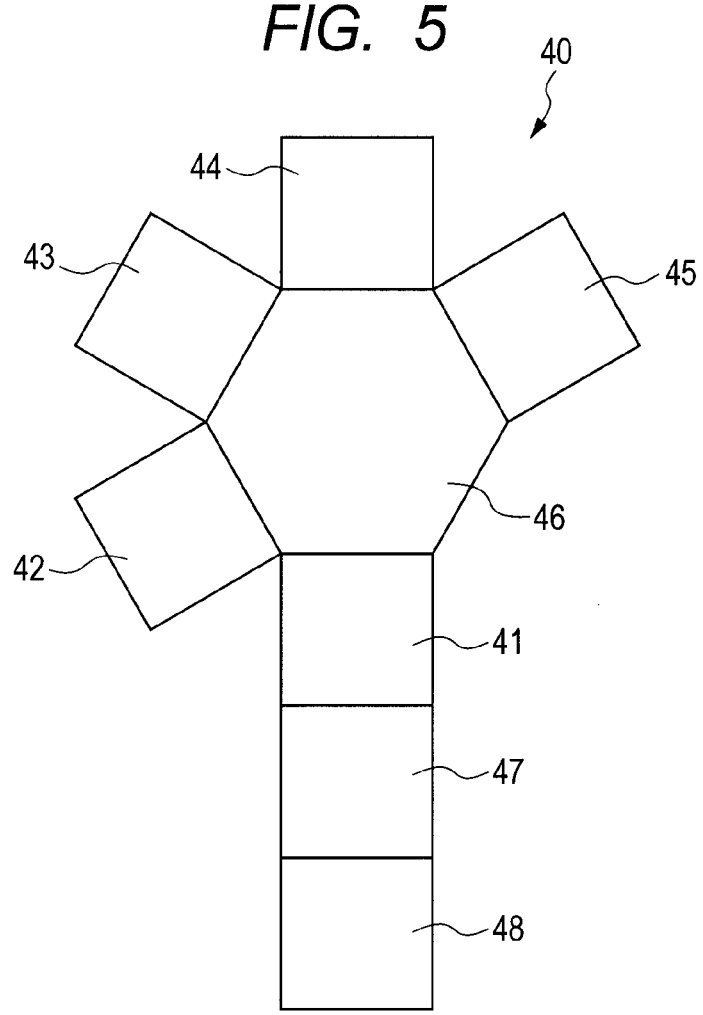
FIG. 5 is a schematic view illustrating a part of the organic EL display device which was used in Example 2.

An organic EL display device was manufactured in a way similar to that of Example 1 except that the step of removing the mask layer was also carried out in closed space. FIG. 5 is a schematic view illustrating a part of the organic EL display device used in this example (Example 2). An apparatus 40 illustrated in FIG. 5 includes, similarly to the apparatus 30 illustrated in FIG. 4, a delivery chamber 41, a drying chamber 42, a first film forming chamber 43, a second film forming chamber 44, an encapsulation operation chamber 45, and a transfer chamber 46, and in addition, includes a water-washing treatment chamber 47 for carrying out the step of removing the mask layer and a water dissipating chamber 48, and the water-washing treatment chamber 47 and the water dissipating chamber 48 are coupled to the delivery chamber 41. More specifically, the apparatus 40 illustrated in FIG. 5 includes multiple chambers including the water-washing treatment chamber 47, the water dissipating chamber 48, and the delivery chamber 41 coupled in the stated order. The substrate 10 transferred into the apparatus 40 illustrated in FIG. 5 passes through the water-washing treatment chamber 47 and the water dissipating chamber 48 in the stated order, and after that, is transferred to the delivery chamber 41. The water-washing treatment chamber 47 and the water dissipating chamber 48 can be evacuated using a vacuum pump (not shown).

An image was displayed on the obtained organic EL display device. As a result, current efficiency which was comparable to that in the case of Example 1 was obtained.

EXAMPLE 3

An organic EL display device was manufactured in a way similar to that of Example 1 except that the step of forming the mask layer and the step of removing the mask layer were changed to steps described in the following. This example is described below.

(A) Steps up to Step of Forming Mask Layer

The organic compound layer was formed on the substrate 10 in a way similar to that of Example 1. Note that, in this example, the electron transport layer 14 was formed so as to have a thickness of 50 nm.

(B) Step of Forming Mask Layer

Next, a thin film of silicon nitride to be the mask layer 20 was formed on the organic compound layer.

(C) Step of Forming Mask Layer

Next, by dry etching using a $CF_4$ gas, the thin film to be the mask layer 20 was processed to form the mask layer 20. Note that, during the dry etching, a part of the electron transport layer 14 was etched by the $CF_4$ gas, which could damage the electron transport layer itself. Therefore, through the following steps, on the one hand, the mask layer 20 was removed, and on the other hand, the electron transport layer 14 was processed.

(D) Step of Removing Mask Layer

After the mask layer was processed and formed by dry etching, the substrate 10 was immersed in isopropyl alcohol. The phenanthroline compound expressed by Formula [6] which was a constituent material of the electron transport layer 14 was etched by an aqueous solution of 60 wt % isopropyl alcohol at a rate of 1 nm/s. Taking this into consideration, the substrate 10 was immersed in an aqueous solution of 60 wt % isopropyl alcohol for 40 seconds. This could leave the electron transport layer 14 in a state of having a thickness of 10 nm. Then, the substrate 10 was rinsed with pure water for one minute.

(E) Step of Drying Organic Compound Layer and Subsequent Steps

In a way similar to that of Example 1, the step of drying the organic compound layer and the subsequent steps were carried out. In this way, the organic EL display device was obtained.

Measurement and evaluation were preformed with respect to the obtained organic EL display device similarly to the case of Example 1. It was found that the current efficiency and the fineness were comparable to those in the case of Example 1. Note that, in this example, when the step of drying the organic compound layer is carried out, instead of the apparatus 30 illustrated in FIG. 4 which was used in Example 1, the apparatus 40 illustrated in FIG. 5 which was used in Example 2 may be used.

EXAMPLE 4

Figure 6:
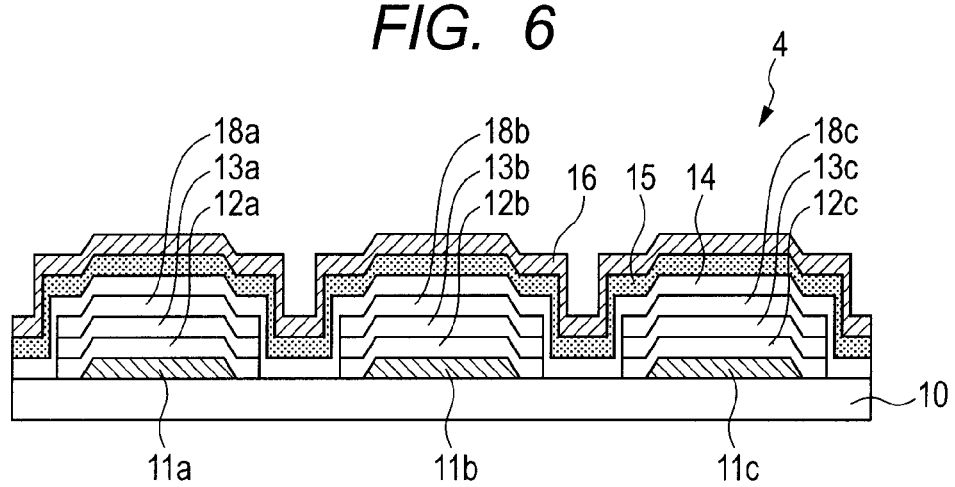
FIG. 6 is a schematic sectional view illustrating an organic EL display device which was manufactured in Example 4.

In this example, an organic EL display device illustrated in FIG. 6 was manufactured. Here, an organic EL display device 4 illustrated in FIG. 6 was different from the organic EL display device 1 illustrated in FIGS. 1A and 1B in that the hole blocking layer (18a, 18b, or 18c) was provided for each element between the emission layer and the electron transport layer and that the electron transport layer 14 was formed as a layer common to the pixels.

In this example, the organic EL display device was manufactured in a way similar to that of Example 1 except that the electron transport layer 14 was formed after Step (9) of Example 1 (the step of removing the mask layer). Note that, in this example, the number of steps for forming the electron transport layer 14 can be reduced from three to one, and thus the manufacturing apparatus and the manufacturing process can be simplified.

Measurement and evaluation were performed with respect to the obtained organic EL display device similarly to the case of Example 1. It was found that the current efficiency and the fineness were comparable to those in the case of Example 1.

EXAMPLE 5

In this example, an organic EL display device was manufactured according to manufacturing steps illustrated in FIGS. 7A to 7F (a second embodiment of the present invention).

Figure 7A:
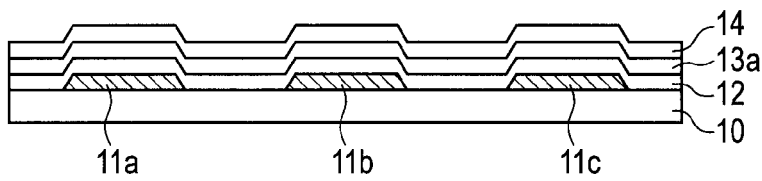
FIGS. 7A, 7B, 7C, 7D, 7E, and 7F are schematic sectional views illustrating a method of manufacturing an organic EL display device according to a second embodiment of the present invention.
Figure 7B:
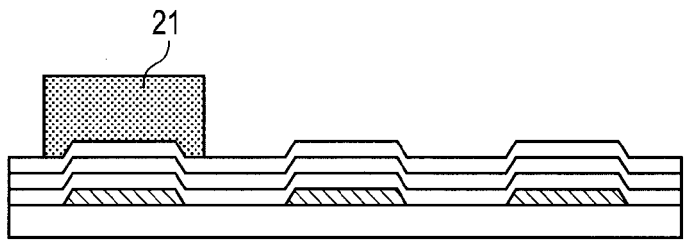
Figure 7C:
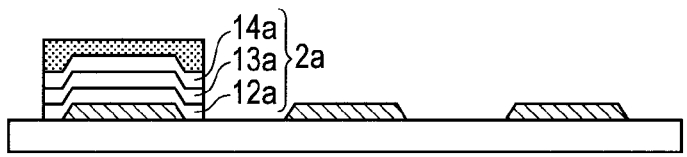
Figure 7D:
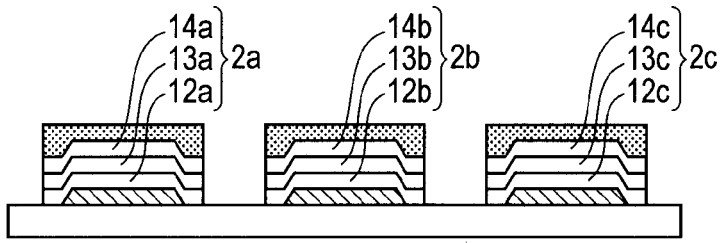
Figure 7E:
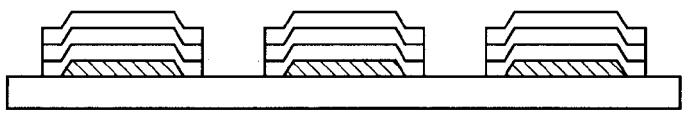
Figure 7F:
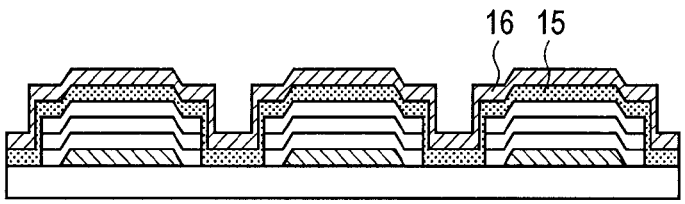

First, in a way similar to that of Example 1, the hole transport layer 12, the blue emission layer 13, and the electron transport layer 14 were formed in the entire emission region on the glass substrate 10 having the first electrode 11a (11b or 11c) which was a reflective electrode formed thereon (FIG. 7A). Then, a PVP aqueous solution was selectively applied to a portion corresponding to the blue pixel by the ink jet method to partially form the first mask layer 21 (FIG. 7B). Here, the thickness of the first mask layer 21 was 1,000 nm. Next, dry etching was carried out using oxygen plasma with respect to a region in which the first mask layer 21 was not provided. Then, the PVP film (first mask layer 21) and the organic compound layer were etched at substantially the same etching rate. Taking this into consideration, the thickness of the PVP film was set larger than the sum of the total thickness of the green organic compound layer (2b) and the total thickness of the red organic compound layer (2c). Then, even when the organic compound in portions corresponding to the green pixel or the red pixel is etched, the organic compound layer (blue organic compound layer 2a) provided under the PVP film was not etched. Therefore, the blue organic compound layer 2a and the PVP film (first mask layer 21) were left only in the portion corresponding to the blue pixel (FIG. 7C). Through sequential formation of the green organic compound layer 2b and the red organic compound layer 2c in a similar way, the organic compound layer (2a, 2b, and 2c) corresponding to pixels of the respective colors could be left in the pixels of the respective colors as illustrated in FIG. 7D. However, as illustrated in FIG. 7D, the PVP film (first mask layer 21) used as the etching mask still remained, and thus, as the subsequent step, the entire substrate was immersed in water to remove the PVP film (first mask layer 21) (FIG. 7E). Next, under conditions similar to those of Example 1, the substrate having the organic compound layer (2a, 2b, and 2c) formed thereon was heated in a vacuum chamber to remove moisture which remained on the organic compound layer (2a, 2b, and 2c). Next, the electron injection layer 15 and the second electrode 16 (translucent electrode) were sequentially formed (FIG. 7F), and finally, the encapsulating step was carried out in a way similar to that of Example 1. In this way, the organic EL display device was obtained. Note that, the current efficiency of the organic EL display device of this example was substantially the same as that of Example 1. Further, in this example, the patterning was carried out by the ink jet method, and thus there was a high degree of flexibility in the substrate size, and even a fifth generation substrate size may be accommodated.

EXAMPLE 6

In this example, an organic EL display device was manufactured according to manufacturing steps illustrated in FIGS. 8A to 8H (a third embodiment of the present invention).

Figure 8A:
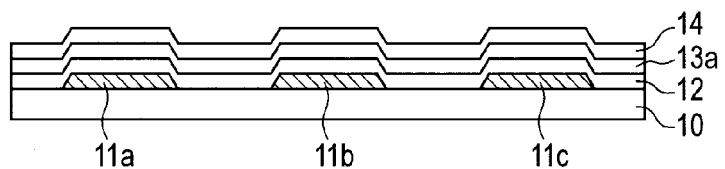
FIGS. 8A, 8B, 8C, 8D, 8E, 8F, 8G, and 8H are schematic sectional views illustrating a method of manufacturing an organic EL display device according to a third embodiment of the present invention.
Figure 8B:
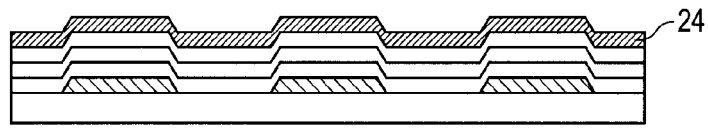
Figure 8C:
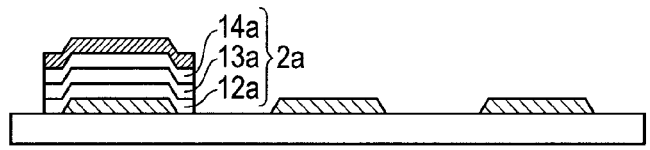
Figure 8D:
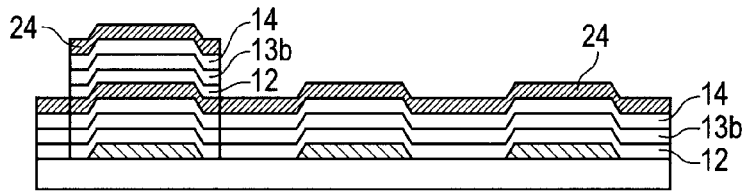
Figure 8E:
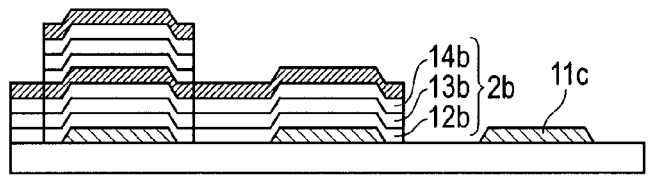
Figure 8F:
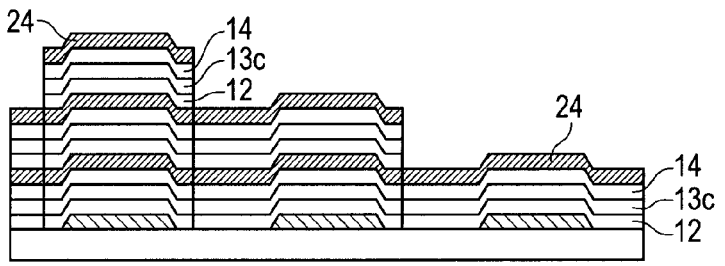
Figure 8G:
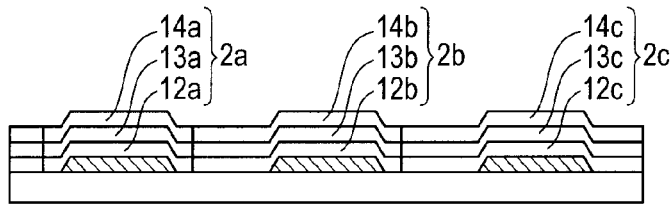
Figure 8H:
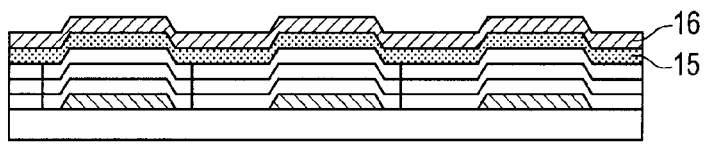

First, in a way similar to that of Example 1, the hole transport layer 12, the blue emission layer 13a, and the electron transport layer 14 were sequentially formed in the entire emission region on the glass substrate 10 having the first electrode 11a (11b or 11c) which was a reflective electrode formed thereon (FIG. 8A). Next, a film of lithium fluoride was formed on the electron transport layer 14 to form a lithium fluoride layer (LiF layer) 24. Here, the thickness of the LiF layer 24 was 100 nm. Note that, the LiF layer 24 functioned as the mask layer (FIG. 8B). Next, the organic compound layer in portions in which the blue organic compound layer 2a was not necessary, that is, portions corresponding to the green pixel and the red pixel was removed by laser ablation using YAG laser (FIG. 8C). More specifically, laser was applied through a photomask having an opening pattern which corresponded to the green pixel and the red pixel to ablate the portions of the organic compound layer to which laser was applied. Here, the laser irradiation energy was 200 mJ/cm$^2$. Next, after the hole transport layer 12, the green emission layer 13b, and the electron transport layer 14 were sequentially formed in the entire emission region, the mask layer (LiF layer 24) was formed (FIG. 8D). Next, laser ablation was carried out using a photomask having an opening pattern which corresponded to the red pixel to expose the reflective electrode of the red pixel (first electrode 11c) (FIG. 8E). By the way, the patterning used in this example was carried out by exposure by one operation using a photomask, and thus a pattern which is as fine as that of Example 1 could be formed. On the other hand, in the portion corresponding to the blue pixel which was left in FIG. 8C, as illustrated in FIG. 8E, organic compound layers for the two colors were laminated. If the upper organic compound layer of the organic compound layers for the two colors was attempted to be removed using laser, the lower organic compound layer might also be damaged. Therefore, in this step, the region to which laser was applied was only the portion corresponding to the red pixel. Next, the hole transport layer 12, the red emission layer 13c, and the electron transport layer 14 were sequentially formed in the entire emission region (FIG. 8F). At this time, in the respective pixel locations, the organic compound layers (2a, 2b, and 2c) of the predetermined colors were formed as the lowermost layer. Next, the entire substrate was immersed in water. Then, the LiF layers 24 were dissolved in water, and the organic compound layers above the LiF layers 24 were removed by lift-off (FIG. 8G). Next, similarly to the cases of other examples, the substrate was heated in a vacuum chamber to remove remaining moisture, and after that, the electron injection layer 15 and the translucent electrode 16 were sequentially formed (FIG. 8H). Finally, the encapsulating step was carried out in a way similar to that of Example 1. In this way, the organic EL display device was obtained.

Characteristics of the obtained organic EL display device were evaluated similarly to the case of Example 1. It was found that the current efficiency and the fineness were comparable to those in the case of Example 1.

EXAMPLE 7

An organic EL display device was manufactured in a way similar to that of Example 1 except that, in Step (10) of Example 1, a film of lithium fluoride (having a thickness of 0.5 nm) was formed on the electron transport layer 14 to form the electron injection layer (common layer 15). Measurement and evaluation were preformed with respect to the obtained organic EL display device similarly to the case of Example 1. It was found that the current efficiency and the fineness were comparable to those in the case of Example 1.

EXAMPLE 8

An organic EL display device was manufactured in a way similar to that of Example 1 except that, in Step (10) of Example 1, instead of forming the laminate of the electron injection layer (common layer 15) and the second electrode 16, cesium carbonate and silver were co-evaporated to form the cathode. Measurement and evaluation were preformed with respect to the obtained organic EL display device similarly to the case of Example 1. It was found that the current efficiency and the fineness were comparable to those in the case of Example 1.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-074836, filed Mar. 30, 2011, and Japanese Patent Application No. 2012-024830, filed Feb. 8, 2012 which are hereby incorporated by reference herein in their entirety.

REFERENCE SIGNS LIST 1 (3, 4): organic EL display device, 2a (2b, 2c): organic compound layer, 10: substrate, 11a (11b, 11c): first electrode, 12 (12a, 12b, 12c): hole transport layer, (13a, 13b, 13c): emission layer, 14 (14a, 14b, 14c): electron transport layer, 15: common layer, 16: second electrode, 17 (17a, 17b, 17c): electron blocking layer, 18 (18a, 18b, 18c): hole blocking layer, 20: mask layer, 21: first mask layer, 22: second mask layer, 23: resist layer, 24: LiF layer, 31 (41): delivery chamber, 32 (42): drying chamber, 33 (43): first film forming chamber, 34 (44): second film forming chamber, 35 (45): encapsulation operation chamber, 36 (46): transfer chamber, 47: water-washing treatment chamber, 48: water dissipating chamber

What is claimed is:

1. A method of manufacturing an organic electroluminescence display device including multiple electroluminescence elements, each of the multiple electroluminescence elements including a first electrode and a second electrode and an organic compound layer provided between the first electrode and the second electrode, the organic compound layer including at least an emission layer, the method comprising:
    forming on a substrate having the first electrode provided thereon the organic compound layer which is insoluble in water;
    forming, on the organic compound layer, a first mask layer comprising a water-soluble material and a second mask layer comprising silicon nitride or silicon oxide in this order;
    forming a resist layer on the second mask layer to conduct patterning using photolithography;
    removing a part of the organic compound layer, the second mask layer, and the first mask layer, which are formed in a region in which the resist layer is not provided;
    removing the first mask layer by contact with a solvent containing water;
    forming, after the removing of the first mask layer, a continuous layer containing one of an alkali metal and an alkaline-earth metal over the multiple electroluminescence elements; and
    forming the second electrode on the layer containing one of the alkali metal and the alkaline-earth metal.

2. The method of manufacturing an organic electroluminescence display device according to claim 1, wherein the organic compound layer and the first and second mask layers are continuously formed in a vacuum atmosphere.

3. The method of manufacturing an organic electroluminescence display device according to claim 1, wherein:
    the layer containing one of the alkali metal and the alkaline-earth metal comprises an electron injection layer containing an organic compound and one of an alkali metal and an alkaline-earth metal.

4. The method of manufacturing an organic electroluminescence display device according to claim 1, wherein the organic compound layer is formed by vacuum deposition.

5. A method of manufacturing an organic electroluminescence display device including multiple electroluminescence elements, each of the multiple electroluminescence elements including a first electrode and a second electrode and an organic compound layer provided between the first electrode and the second electrode, the organic compound layer including at least an emission layer, the method comprising:
- forming on a substrate having the first electrode provided thereon the organic compound layer which is insoluble in water;
- providing a mask layer containing a water-soluble material using photolithography in a part of a region in which the organic compound layer is formed;
- removing a part of the organic compound layer which is formed in a region in which the mask layer is not provided;
- removing the mask layer by contact with a solvent containing water;
- forming, after the removing of the mask layer, a continuous layer containing one of an alkali metal and an alkaline-earth metal over the multiple electroluminescence elements; and
- forming the second electrode on the layer containing one of the alkali metal and the alkaline-earth metal.

6. The method of manufacturing an organic electroluminescence display device according to claim 5, wherein the organic compound layer and the first and second mask layers are continuously formed in a vacuum atmosphere.

7. The method of manufacturing an organic electroluminescence display device according to claim 5, wherein the layer containing one of the alkali metal and the alkaline-earth metal comprises an electron injection layer containing an organic compound and one of an alkali metal and an alkaline-earth metal.

* * * * *